(12) United States Patent
Liao et al.

(10) Patent No.: US 11,908,940 B2
(45) Date of Patent: *Feb. 20, 2024

(54) FIELD EFFECT TRANSISTOR WITH A HYBRID GATE SPACER INCLUDING A LOW-K DIELECTRIC MATERIAL

(71) Applicant: Intel Corporation, Santa Clara, CA (US)

(72) Inventors: Szuya S. Liao, Portland, OR (US); Pratik A. Patel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 85 days.

This patent is subject to a terminal disclaimer.

(21) Appl. No.: 17/530,741

(22) Filed: Nov. 19, 2021

(65) Prior Publication Data

US 2022/0077311 A1 Mar. 10, 2022

Related U.S. Application Data

(63) Continuation of application No. 16/306,890, filed as application No. PCT/US2016/040841 on Jul. 1, 2016, now Pat. No. 11,183,592.

(51) Int. Cl.
*H01L 29/78* (2006.01)
*H01L 27/092* (2006.01)
(Continued)

(52) U.S. Cl.
CPC ........ *H01L 29/785* (2013.01); *H01L 27/0924* (2013.01); *H01L 29/41791* (2013.01);
(Continued)

(58) Field of Classification Search
CPC ............... H01L 29/785; H01L 27/0924; H01L 29/41791; H01L 29/6653; H01L 29/6656;
(Continued)

(56) References Cited

U.S. PATENT DOCUMENTS 11,183,592 B2 * 11/2021 Liao ................. H01L 29/66568
2011/0031538 A1 2/2011 Hsieh et al.
(Continued)

OTHER PUBLICATIONS

International Preliminary Report on Patentability dated Jan. 10, 2019 for PCT Patent Application No. PCT/US2016/040841.
(Continued)

*Primary Examiner* — Caleen O Sullivan
(74) *Attorney, Agent, or Firm* — Essential Patents Group, LLP

(57) ABSTRACT

A FET including a hybrid gate spacer separating a gate electrode from at least one of a source, a drain, or source/drain contact metallization. The hybrid spacer may include a low-k dielectric material for a reduction in parasitic capacitance. The hybrid spacer may further include one or more other dielectric materials of greater relative permittivity that may protect one or more surfaces of the low-k dielectric material from damage by subsequent transistor fabrication operations. The hybrid spacer may include a low-k dielectric material separating a lower portion of a gate electrode sidewall from the source/drain terminal, and a dielectric spacer cap separating to an upper portion of the gate electrode sidewall from the source/drain terminal. The hybrid spacer may have a lower total capacitance than conventional spacers while still remaining robust to downstream fabrication processes. Other embodiments may be described and/or claimed.

20 Claims, 14 Drawing Sheets

(51) Int. Cl.
  *H01L 29/417*   (2006.01)
  *H01L 29/66*    (2006.01)
(52) U.S. Cl.
  CPC ...... *H01L 29/6653* (2013.01); *H01L 29/6656* (2013.01); *H01L 29/66795* (2013.01)
(58) Field of Classification Search
  CPC ....... H01L 29/66795; H01L 21/823864; H01L 29/66568; H01L 29/66545
  USPC ....................................................... 257/365
  See application file for complete search history.

(56)         References Cited

U.S. PATENT DOCUMENTS

| 2011/0117712 | A1 | 5/2011  | Muralidhar et al. |
| 2013/0049142 | A1 | 2/2013  | Liu et al. |
| 2015/0206955 | A1 | 7/2015  | Kim et al. |
| 2015/0333148 | A1 | 11/2015 | Koo et al. |
| 2017/0110568 | A1 | 4/2017  | Palle et al. |
| 2018/0083136 | A1 | 3/2018  | Xie et al. |
| 2018/0374927 | A1 | 12/2018 | Liu et al. |
| 2020/0006062 | A1 | 1/2020  | Jhan et al. |
| 2020/0006158 | A1 | 1/2020  | Chen et al. |
| 2020/0098886 | A1 | 3/2020  | Liu et al. |

OTHER PUBLICATIONS

International Search Report and Written Opinion dated Apr. 26, 2017 for PCT Patent Application No. PCT/US2016/040841.
Non-Final Office Action from U.S. Appl. No. 16/306,890 dated Apr. 21, 2021, 12 pgs.
Non-Final Office Action from U.S. Appl. No. 16/306,890 dated Dec. 10, 2020, 6 pgs.
Notice of Allowance from Taiwanese Patent Application No. 106117493 dated Apr. 28, 2021, 4 pgs.
Notice of Allowance from U.S. Appl. No. 16/306,890 dated Aug. 5, 2021, 9 pgs.
Office Action from Taiwan Patent Application No. 106117493 dated Oct. 20, 2020, 16 pgs.

* cited by examiner

FIELD EFFECT TRANSISTOR WITH A HYBRID GATE SPACER INCLUDING A LOW-K DIELECTRIC MATERIAL

CLAIM OF PRIORITY

This application is a Continuation of, and claims the benefit of priority to, U.S. patent application Ser. No. 16/306,890, filed on Dec. 3, 2018 and titled "FIELD EFFECT TRANSISTOR WITH A HYBRID GATE SPACER INCLUDING A LOW-K DIELECTRIC MATERIAL," which is a National Stage Entry of, and claims the benefit of priority to, PCT Application No. PCT/US2016/040841, filed on Jul. 1, 2016 and titled "FIELD EFFECT TRANSISTOR WITH A HYBRID GATE SPACER INCLUDING A LOW-K DIELECTRIC MATERIAL," which is incorporated by reference in entirety.

BACKGROUND

Transistor switching speed is inversely proportional to transistor capacitance. However, as lateral dimensions of transistors continue to shrink, parasitic capacitance becomes more significant. A substantial portion of parasitic capacitance of field effect transistors (FETs) is associated with coupling between the gate electrode and source/drain semiconductor terminals (e.g., contact metallization, source/drain semiconductor), which are typically separated by a self-aligned dielectric material feature, often referred to as the "gate spacer." The gate spacer may laterally separate the gate electrode from source/drain terminals by less than 10 nm in state-of-the-art complementary metal-oxide-semiconductor (CMOS) processing. Compounding reductions in lateral spacing between the gate and source/drain terminals, the vertical height of the gate and/or source/drain terminals has trended upward.

Along with transistor geometry, parasitic capacitance associated with the gate spacer is also a function of relative permittivity of the dielectric material employed. Although various dielectric materials spanning a wide range of permittivity are known, many are not easily integrated into state-of-the-art CMOS processes. Often, materials of lower relative permittivity lack robustness to downstream processing that the spacer is to survive. This constraint has limited spacer dielectric material to those having a relative permittivity over 5.0 (for the dielectric material as measured in a bulk state).

BRIEF DESCRIPTION OF THE DRAWINGS

The embodiments described herein are illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
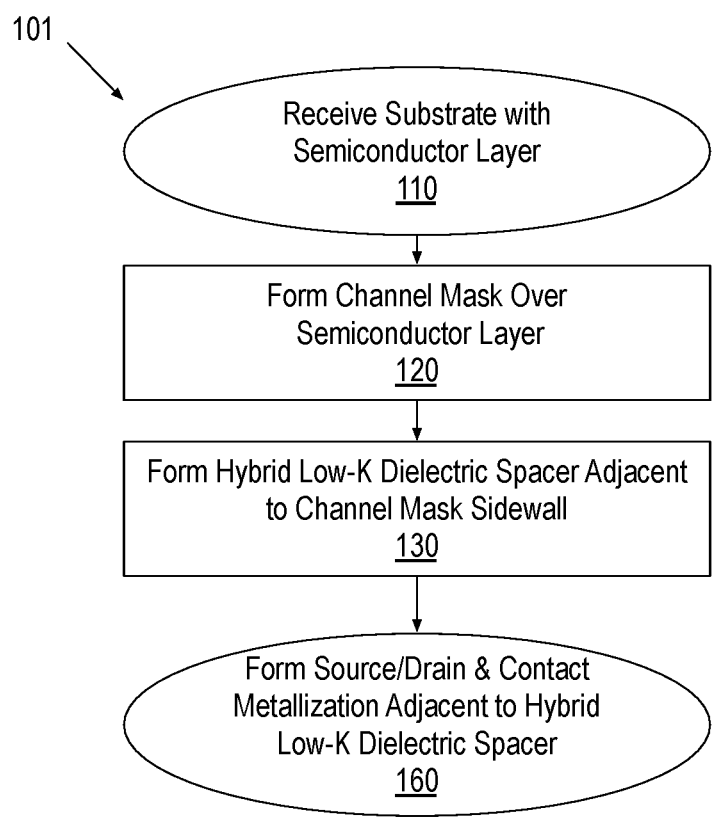
FIG. 1 is a flow diagram illustrating methods of reducing parasitic capacitance associated with a gate electrode spacer, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "" and "on" as used herein refer to a relative position of one component, feature, or material layer with respect to other components, features, or material layers where such physical relationships are noteworthy. In some contexts, the terms "over" and "under" describe a relative position on a z-axis perpendicular to a substrate working surface, while the term "adjacent" describes a relative position on an x-axis or y-axis parallel to the substrate working surface. In other contexts, the terms "over" and "under" are employed to describe relative positions of material layers within a multi-layered material stack. The terms "over," "under," "between," "adjacent" and "on" are therefore not mutually exclusive. For example, one material layer that is "over" another material layer within a stack may also be adjacent to that material layer where the stack of layers covers an underlying feature sidewall. Furthermore, one material disposed over, under, or adjacent to another may be directly in contact or may have one or more intervening materials. Moreover, one material disposed between two material layers may be directly in contact with the two layers or may be separated from one or other of the two layers by one or more intervening layers. In contrast, a first material or material "on" or "interfacing with" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

FIG. 1 is a flow diagram illustrating methods 101 for reducing parasitic capacitance associated with a gate electrode spacer, in accordance with some embodiments. Methods 101 begin at operation 110 where a substrate with a semiconductor layer is received. Any known substrate and semiconductor layer may be received at operation 110 as embodiments need not be limited in this respect. At operation 120, a channel mask is formed over semiconductor, thereby defining a region of semiconductor that is to serve as the FET channel. At operation 130, a hybrid low-k dielectric spacer is formed adjacent to a sidewall of the channel mask. The FET is then completed at operation 160 where the source/drain terminals (impurity-doped semiconductor and contact metallization) is formed with at least the hybrid low-k dielectric spacer separating the contact metallization from the channel mask.

Methods 101, and transistors fabricated according to methods 101, incorporate a hybrid dielectric spacer disposed proximal to the transistor gate electrode and the source/drain semiconductor, and/or source/drain contact metallization. In advantageous embodiments, the hybrid spacer includes a low-k dielectric material for a reduction in parasitic capacitance and further includes one or more other dielectric materials of greater relative permittivity protecting one or more surfaces of the low-k dielectric material from damage by subsequent transistor fabrication operations. The hybrid spacer may include a low-k dielectric spacer proximal a lower portion of a gate electrode sidewall, and a dielectric spacer cap proximal to an upper portion of the gate electrode sidewall. The hybrid spacer may have a lower total capacitance than conventional spacers while remaining robust to downstream fabrication processes. Various exemplary embodiments are described below to illustrate how a low-k dielectric material may be employed within a hybrid spacer.

In the present context of gate spacers, a low-k dielectric material has a relative permittivity (dielectric constant or k-value) below 5.0. For example, a silicon nitride (SiN) spacer would be associated with a relative permittivity of 7-8, and is therefore not considered a low-k spacer material. A compound such as carbon-doped silicon (SiC) may have a dielectric constant above or below 5.0 depending on its specific composition, defect density etc. Many pure silicon carbide compositions are known to have a k value of 3-4, for example, and such materials are therefore to be considered low-k dielectrics in the present context of gate spacers. A compound such as carbon-doped silicon nitride (SiCN) may have a k value above or below 5.0, again depending on its specific composition, etc. Some SiCN compositions, with k values in the mid-4's for example, are also considered low-k dielectrics in the present context. Some silicon oxynitride (SiON) compositions may also be above or below the 5.0 threshold, depending on their nitrogen content and defect density, for example. Silicon dioxide ($SiO_2$), associated with a k value of 3.9, is considered a low-k dielectric in the present context of gate spacers. Materials with a relative permittivity below that of silicon dioxide, such as, but not limited to, carbon-doped silicon oxide (SiOC(H)), polyimide, HSQ, or MSQ, are also considered low-k dielectric materials in the present context just as they typically are in the context of inter-layer dielectric (ILD) materials. Many of the above materials falling within the low-k regime (k<5.0) are not easily integrated into CMOS processing. For example, these materials may have high etch rates in wet chemistries and/or are readily degraded when exposed to plasma ashing. The later is particularly true for materials displaying a k value below 3.9 (e.g., SiOC).

Hybrid spacers in accordance with some embodiments further include one or more additional dielectric materials protecting one or more surfaces of the low-k dielectric material. The additional dielectric materials may have a relative permittivity greater than that of the low-k dielectric material and may cover, seal, or encapsulate an inner, outer, or top surface of the low-k dielectric material. As a result of incorporating the low-k dielectric, the hybrid spacer may display an overall lower capacitance than conventional spacers, yet the low-k dielectric may remain protected from subsequent processing.

Figure 2:
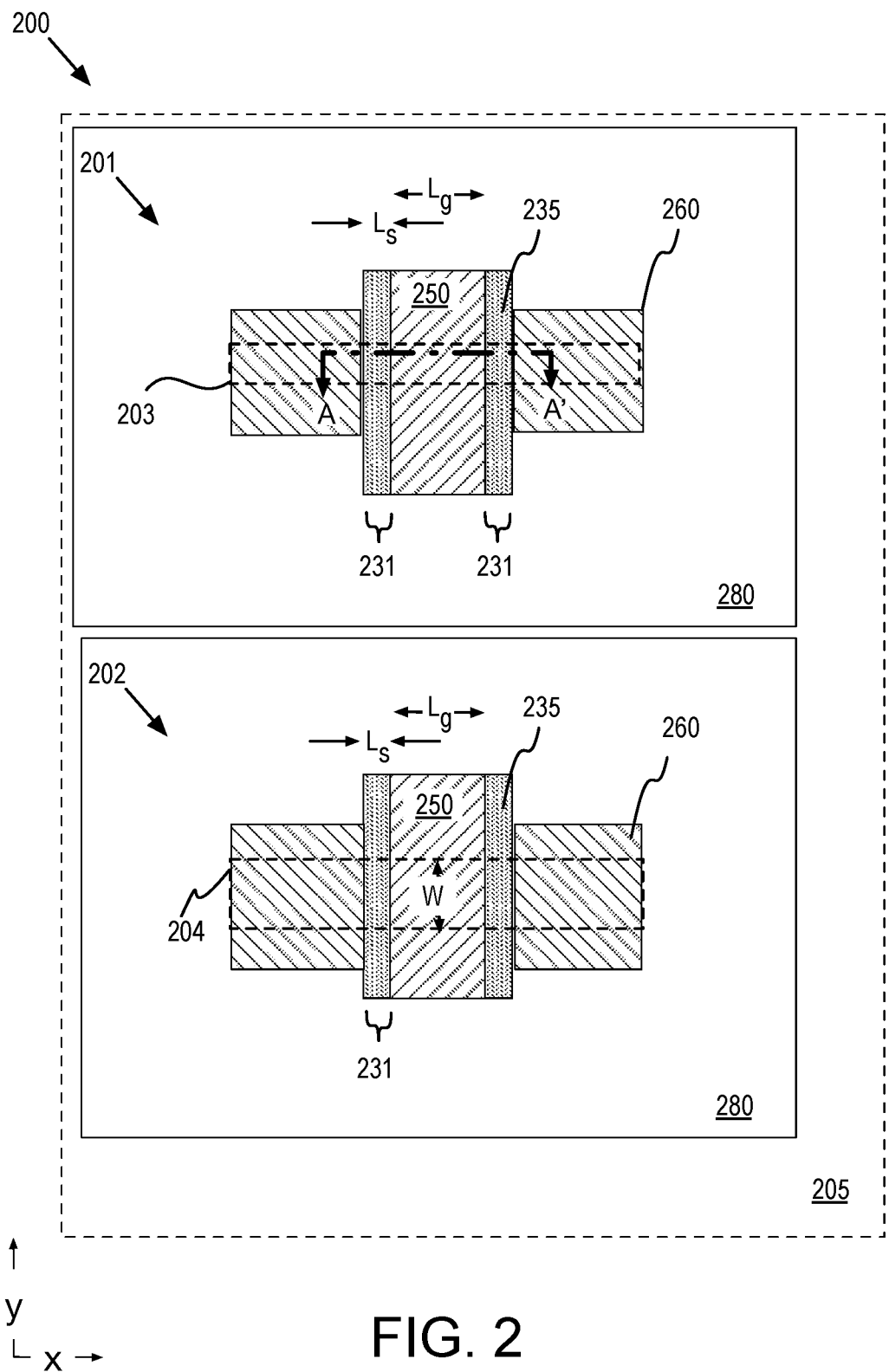
FIG. 2 is a plan view of a pair of FETs disposed over a substrate, in accordance with some embodiments.

FIG. 2 is a plan view of CMOS circuitry 200 including an NMOS FET 201 and a PMOS FET 202 disposed over a substrate layer 205 and surrounded by a field isolation dielectric material 280. In the illustrated embodiments, each of NMOS FET 201 and PMOS FET 202 include a hybrid spacer 231, for example as described further below. In some other embodiments, only one of NMOS FET 201 and PMOS FET 202 includes a hybrid spacer 231 while the other employs any known gate spacer.

FETs 201, 202 may employ a wide variety of transistor channel architectures including planar and non-planar implementations. For planar implementations, gate electrode 235 is disposed over a semiconductor channel having a planar surface with a transverse width W. For non-planar (e.g., finFET) implementations, gate electrode 250 is disposed over a semiconductor channel having a non-planar surface of a length including transverse width W as well as the two sidewall heights of fin 203 (204). Substrate layer 205 may be any suitable carrier, which may include one or more materials upon which the semiconductor channel of the FETs was formed (e.g., monocrystalline silicon, silicon-germanium, etc.), or one or more other materials upon which the FET channel semiconductor was transferred (e.g., one or more additional strata of FETs, a polymer sheet, etc.). Isolation material 280 may be any dielectric material suitable for providing electrical isolation between FETs 201, 202. In some exemplary embodiments, isolation material 280 is one or more layer of silicon dioxide, silicon nitride, SiON, SiOC, SiOCH, HSQ, or MSQ. Other materials known to be suitable for the purpose may also be utilized, including other low-k materials having a relative dielectric constant below 3.9.

In advantageous embodiments where symmetry of FET 201 (202) is maintained, hybrid spacer 231 is disposed between the channel semiconductor and source semiconductor, as well as between the channel semiconductor and drain semiconductor. Such symmetrical architectures may allow a drain of one transistor to be employed as a source of another transistor.

FETs 201, 202 are each associated with a gate length $L_g$ and a lateral spacing $L_s$ between source/drain contact metallization 260 and an edge or sidewall of gate electrode 250. Hybrid spacer 231 is disposed at least within lateral spacing $L_s$, offsetting the source/drain contact metallization 260 and/or underlying source/drain semiconductor from channel semiconductor underlying gate electrode 250. One or more first portion of hybrid spacer 231 is a low-k dielectric material while one or more second portion of the hybrid spacer 231 is a dielectric material having a higher relative permittivity than that of the low-k dielectric material. In some such embodiments, at least one dielectric material in hybrid spacer 231 has a k value of at least 5.0. In other embodiments, all the dielectric materials within hybrid spacer 231 have a k value below 5.0. For example, a low-k dielectric with a k value well below 5.0 may be protected by another low-k dielectric having a k-value only slightly below 5.0.

Although specific dimensions vary with fabrication technology generations, in one example where $L_g$ is 2-10 nm, a hybrid spacer may occupy 2-10 nm lateral spacing $L_s$. In some embodiments illustrated by FIG. 2, a spacer cap 235 comprising a protective dielectric material occupies the full lateral spacing $L_s$. Spacer cap 235 is further disposed atop a low-k dielectric material portion of hybrid spacer 231. A lower portion of gate electrode 250 is capacitively coupled to contact metallization 260 through the low-k dielectric material while the upper portion of gate electrode 250 is capacitively coupled to contact metallization 260 through a higher-k dielectric material of spacer cap 235.

Figure 3:
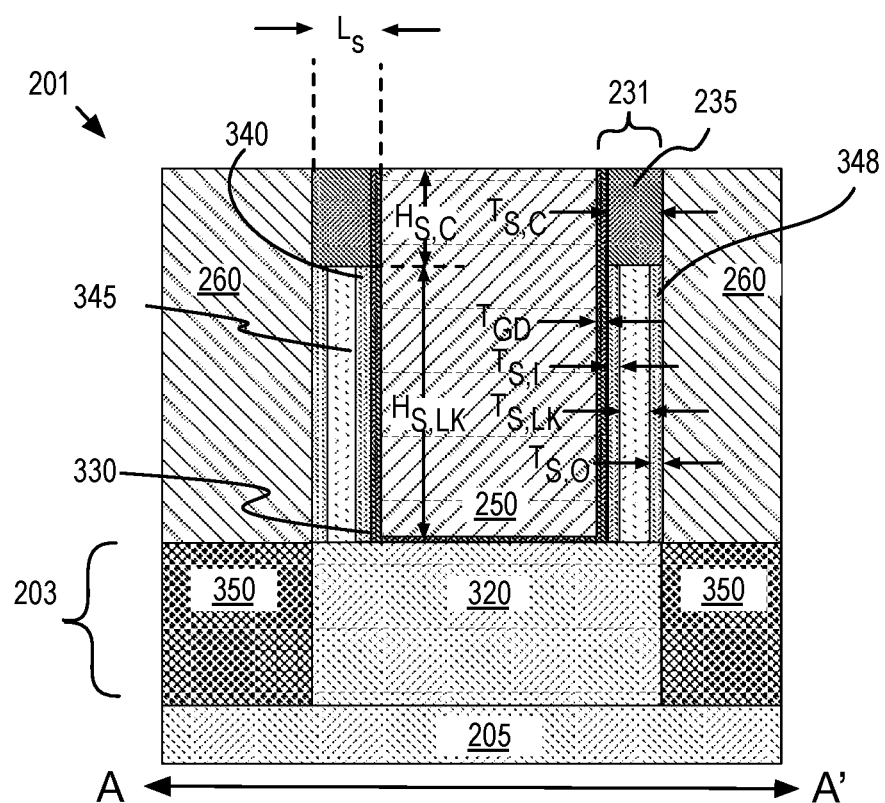
FIG. 3 illustrates a cross-sectional view through a length of channel semiconductor and source/drain semiconductor of a FET depicted in FIG. 2, in accordance with some embodiments.

FIG. 3 illustrates a cross-sectional view through a length of channel semiconductor and source/drain semiconductor of FET 201, in accordance with some embodiments. Hybrid gate spacer 231 in accordance with some embodiments herein includes low-k dielectric 345, and further includes one or more of an inner dielectric material layer 340, an outer dielectric material layer 348, and spacer cap 235. When present, any and all of layers 340, 348 and cap 235 are of a dielectric material distinct from low-k dielectric 345. In some exemplary embodiments, the one ore more dielectric materials employed for layers 340, 348 and cap 235 have a relative permittivity greater than that of low-k dielectric 345. Notably, not all of layers 340, 348 and cap 235 need be present within hybrid spacer 235. Rather, any subset of these materials may be present to protect various surfaces of low-k dielectric 345. In the embodiment illustrated in FIG. 3, hybrid spacer 231 has a fully encapsulated low-k dielectric 345. In alternative embodiments, for example as further illustrated in FIG. 4-9, hybrid spacer 231 includes only a subset of the protective dielectric materials illustrated in FIG. 3. For embodiments where two or more of layers 340, 348 and cap 235 are present, the dielectric material composition of one need not be the same as any other, although a single dielectric material may be employed in multiple regions or layers of a hybrid spacer.

Low-k dielectric 345 may be any dielectric material having a relative permittivity below 5.0. In some further embodiments, low-k dielectric 345 is of a dielectric material having a relative permittivity below 3.9. In some examples, low-k dielectric 345 is a SiON, SiC, SiCN, or SiOC composition that has a relative permittivity below 5.0. Low-k dielectric 345 may also be of other compositions having a relative permittivity below 5.0. Low-k dielectric 345 occupies a lateral spacing between gate electrode 250 and source/drain contact metallization 260 corresponding to the low-k spacer thickness $T_{S,LK}$. In some advantageous embodiments low-k spacer thickness $T_{S,LK}$ is 2-5 nm. Low-k dielectric 345 provides a spacer along a lower portion of the sidewall of gate electrode 250 that is equal to low-k spacer height $H_{S,LK}$. The gate electrode sidewall height further includes an upper portion equal to spacer cap height $H_{S,C}$ that is proximal to spacer cap 235. In some embodiments, low-k spacer height $H_{S,LK}$ is at least 50% of the gate electrode sidewall height, and low-k spacer height $H_{S,LK}$ is advantageously at least twice spacer cap height $H_{S,C}$. In some exemplary embodiments, low-k spacer height $H_{S,LX}$ is 10-30 nm.

Spacer cap 235 may be of any dielectric material known to be more resistant to downstream processing than low-k dielectric 345. The inventors have found spacer cap 235 to be particularly helpful in protecting low-k dielectric 345 during subsequent processing. Indeed, the inventors have found low-k dielectric 345 may be sufficiently protected by only spacer cap 345 so that additional complexity associated with inner and outer dielectric layers 340, 348 may be avoided. Spacer cap 235 may include a dielectric material having a higher relative permittivity than low-k dielectric 345. In some such embodiments, spacer cap 235 includes a dielectric material having a relative permittivity of at least 5.0. In some exemplary embodiments, spacer cap 235 includes one or more of SiC, SiCN, SiN, SiON. Dielectric materials of even higher relative permittivity, such as, but not limited to, $Al_2O_3$, may also be employed as spacer cap 235. However, depending on the spacer cap height $H_{S,C}$, a material of somewhat lower relative permittivity may be more or less advantageous from the standpoint of the hybrid spacer's overall parasitic capacitance contribution.

As illustrated in FIG. 3, spacer cap 235 is disposed over a top surface of low-k dielectric 235. Spacer cap 235 is therefore not merely an upper layer of a multi-layered spacer, but rather is a cap atop an underlying spacer of one or more material layers that includes low-k dielectric 345. As such, low-dielectric 345 may be considered a first (low-k) spacer while spacer cap 235 may be considered a cap and/or second (higher-k) spacer stacked upon the first (low-k) spacer. For the exemplary embodiment illustrated in FIG. 3, spacer cap 235 occupies the same portion of lateral spacing $L_s$ as low-k spacer thickness $T_{S,LK}$, (e.g., $T_{S,C} \geq T_{S,LX}$), and further occupies the portion of lateral spacing $L_s$ occupied by inner and outer dielectric layers 340, 348 (i.e., $T_{S,C}=T_{S,LK}+T_{S,I}+T_{S,O}$). In some advantageous embodiments spacer cap thickness $T_{S,C}$ is 2-10 nm. In some further embodiments, spacer cap height $H_{S,C}$ is 5-10 nm. In some embodiments, and as further illustrated in FIG. 3, a top surface of spacer cap 235 is planar with both gate electrode 250 and source/drain contact metallization 260. As such, spacer cap height $H_{S,C}$ may vary as a function of over-polish performed during planarization of FET 201.

Inner dielectric layer 340, if present, is disposed between low-k dielectric 345 and gate electrode 250. In some embodiments, inner dielectric layer 340 is one layer of a multi-layered spacer that includes low-k dielectric 345. Inner dielectric layer 340 may be of any dielectric material known to be more resistant to downstream processing than is low-k dielectric 345. Depending on the transistor fabrication flow, inner dielectric layer 340 may be more or less advantageous relative to embodiments lacking inner dielectric layer 340. For example, in a gate-last fabrication flow, an inner surface of low-k dielectric 345 may be exposed to processes associated with sacrificial gate stack removal. If such processes are detrimental to low-k dielectric 345, inner dielectric layer 340 may be highly advantageous. If low-k dielectric 345 is otherwise sufficiently shielded from such processes, for example, by spacer cap 235, or where an inner surface of low-k dielectric 345 may never become exposed to downstream processes (e.g., a gate-first fabrication flow), inner dielectric layer 340 may be less advantageous as there may be an associated penalty with respect to parasitic capacitance. Inner dielectric layer 340 may include a dielectric material having a higher relative permittivity than that of low-k dielectric 345. In some such embodiments, inner dielectric layer 340 includes a dielectric material having a relative permittivity of at least 5.0. In some exemplary embodiments, inner dielectric layer 340 includes one or more of SiC, SiCN, SiN, SiON. Dielectric materials of even higher relative permittivity, such as, but not limited to, $Al_2O_3$, $HfO_2$, $TiO_2$, and their silicates and nitrides may also be employed as inner dielectric layer 340.

Inner dielectric layer 340 occupies a lateral spacing between gate electrode 250 and source/drain contact metallization 260 corresponding to the inner spacer thickness $T_{S,I}$. In some advantageous embodiments inner spacer thickness $T_{S,I}$ is less than low-k spacer thickness $T_{S,LK}$. In some such embodiments, inner spacer thickness $T_S$, is 1-2 nm while low-k spacer thickness $T_{S,LK}$ is 2-5 nm. For some embodiments including spacer cap 235, inner dielectric layer 340 is a spacer layer that extends along only a lower portion of the sidewall of gate electrode 250 that is equal to low-k spacer height $H_{S,LK}$. In other embodiments including spacer cap 235, inner dielectric layer 340 is a spacer layer that extends along both upper and lower portions of the gate electrode sidewall, having a height equal to the low-k spacer height $H_{S,LK}$ summed with the spacer cap height $H_{S,C}$. For such embodiments, the spacer cap is disposed over the low-k spacer dielectric, but not disposed over the inner dielectric layer. The inner dielectric layer then separates the gate electrode from the spacer cap just as it separates the gate electrode from the low-k spacer dielectric. As described further below, such a structure is indicative of a portion of low-k spacer dielectric having been replaced with the spacer cap by a process that was selective to the inner dielectric layer.

As further shown in FIG. 3, for some embodiments where a gate dielectric 330 forms a liner on a sidewall of gate electrode 250, gate dielectric 330 may be in direct contact with inner dielectric layer 340, or low-k dielectric 345, depending on whether inner dielectric layer 340 is present. Gate dielectric 330, having a gate dielectric thickness $T_{GD}$, may therefore be disposed between hybrid spacer 231 a gate electrode 250. For some such embodiments where inner dielectric layer 340 has the same composition as gate dielectric 330, gate dielectric thickness $T_{GD}$ may appear to be thicker along the gate electrode sidewall than between gate electrode 250 and channel semiconductor 320. In other embodiments where gate dielectric 330 does not form a liner along sidewalls of gate electrode 250, gate electrode 250 may be in direct contact with inner dielectric layer 340, or low-k dielectric 345, depending on whether inner dielectric layer 340 is present.

Outer dielectric layer 348, if present, is disposed between low-k dielectric 345 and source/drain contact metallization 260 and/or source/drain semiconductor 350. In some embodiments, outer dielectric layer 348 is one layer of a multi-layered spacer that includes low-k dielectric 345. Outer dielectric layer 348 may be of any dielectric material known to be more resistant to downstream processing than is low-k dielectric 345. Depending on the transistor fabrication flow, outer dielectric layer 348 may be more or less advantageous over embodiments lacking outer dielectric layer 348. For example, in a self-aligned contact (SAC) process flow, an outer surface of low-k dielectric 345 may otherwise be exposed to processes associated with contact etch. If such processes are detrimental to low-k dielectric 345, outer dielectric layer 348 may be highly advantageous. For a fabrication flow where an outer surface of low-k dielectric 345 is otherwise sufficiently shield from downstream processes, for example by spacer cap 235, outer dielectric layer 348 may be less advantageous as there may be an associated penalty with respect to parasitic capacitance. Outer dielectric layer 348 may include a dielectric material having a higher relative permittivity than that of low-k dielectric 345. In some such embodiments, outer dielectric layer 348 includes a dielectric material having a relative permittivity of at least 5.0. In some exemplary embodiments, outer dielectric layer 348 includes one or more of SiC, SiCN, SiN, SiON. Dielectric materials of even higher relative permittivity, such as, but not limited to, $Al_2O_3$, $HfO_2$, $TiO_2$, and their silicates and nitrides may also be employed as outer dielectric layer 348.

Outer dielectric layer 348 occupies a lateral spacing between gate electrode 250 and source/drain contact metallization 260 that corresponds to the outer spacer thickness $T_{S,O}$. In some advantageous embodiments, outer spacer thickness $T_{S,O}$ is less than low-k spacer thickness $T_{S,LK}$. In some such embodiments, outer spacer thickness $T_S$, is 1-2 nm while low-k spacer thickness $T_{S,LK}$ is 2-5 nm. For some embodiments including spacer cap 235, outer dielectric layer 348 is a spacer layer that extends along only a lower portion of the sidewall of gate electrode 250 equal to low-k spacer height $H_{S,LK}$. In other embodiments including spacer cap 235, outer dielectric layer 348 is a spacer layer that extends along both upper and lower portions of the gate electrode sidewall, having a height equal to the low-k spacer height $H_{S,LK}$ summed with spacer cap height $H_{S,C}$. For such embodiments, the spacer cap is disposed over the low-k spacer dielectric, but not disposed over the outer dielectric layer. The outer dielectric layer then separates the source/drain contact metallization from the spacer cap just as it separates the contact metallization from the low-k spacer dielectric. As described further below, such a structure is indicative of a portion of low-k spacer dielectric having been replaced with the spacer cap by a process that was selective to the outer dielectric layer.

As further shown in FIG. 3, FET 201 includes a channel semiconductor 320 is disposed between source/drain semiconductor 350. Source/drain semiconductor 350 may be heavily-doped with an n-type impurity. Channel semiconductor 320 may be lightly doped with a p-type impurity, or substantially undoped (e.g., intrinsic). In some exemplary embodiments, channel semiconductor 320 is a monocrystalline group IV semiconductor, a monocrystalline group III-V semiconductor, or a monocrystalline group III-N semiconductor. Group IV semiconductor embodiments may include silicon, germanium, or alloys thereof. III-V semiconductor embodiments include a first sub-lattice of at least one element from group III of the periodic table (e.g., Al, Ga, In) and a second sub-lattice of at least one element of group V of the periodic table (e.g., P, As, Sb). The III-V compound may be a binary, ternary, or quaternary material. In some other exemplary embodiments, channel semiconductor 320 is a polycrystalline group IV semiconductor, a polycrystalline group III-V semiconductor, or a polycrystalline group III-N semiconductor. In still other embodiments, channel semiconductor 320 is an oxide semiconductor, such as, but not limited to IGZO.

Source/drain semiconductor 350 and channel semiconductor 320 form an interface, which may be a homojunction (i.e., of the same majority lattice constituents) or heterojunction (i.e., having different majority lattice constituents). Source/drain semiconductor 350 may also form an interface with substrate layer 205, which may be a homojunction (e.g., a p-type epitaxial silicon layer interface with an undoped silicon substrate), or heterojunction (e.g., a Ge layer interface with undoped silicon substrate).

As further shown in FIG. 3, FET 201 includes a gate stack further including gate electrode 250 and gate dielectric 330 disposed over channel semiconductor 320. While any known electrode and insulator materials may be utilized in the gate stack, in one exemplary embodiment a high-k material having a bulk relative permittivity of 9, or more, is employed as gate dielectric 330. Exemplary high-k gate dielectric materials include metal oxides, such as, but not limited to $Al_2O_3$, $HfO_2$, $HfAlO_x$, $HfSiO_x$, or $TaSiO_x$ may also be suitable. Gate electrode 250 may be any material that has a work function suitable for a desired channel threshold voltage $(V_t)$ as a function of the composition of channel semiconductor 320. Gate electrode 250 may advantageously have a work function below 5 eV. Gate electrode 250 may be a doped semiconductor and/or may include an elemental metal layer, a metal alloy layer, or laminate structure of either or both. In some embodiments gate electrode 250 is a metal nitride, such as TiN (e.g., 4.0-4.7 eV). Gate electrode 250 may also comprise Al (e.g., TiAlN). Other alloy constituents may also be employed in gate electrode 250, such as, but not limited to, C, Ta, W, Pt, and Sn.

As further shown in FIG. 3, FET 201 includes source/drain contact metallization 260, which may be any metal known to be suitable as a source/drain contact for the composition of impurity-doped semiconductor 350. Contact metallization 260 may be any metal that forms a rectifying (i.e., Schottky) contact or resistive (ohmic) contact to source/drain semiconductor 350, as embodiments are not limited in the context.

Figure 4:
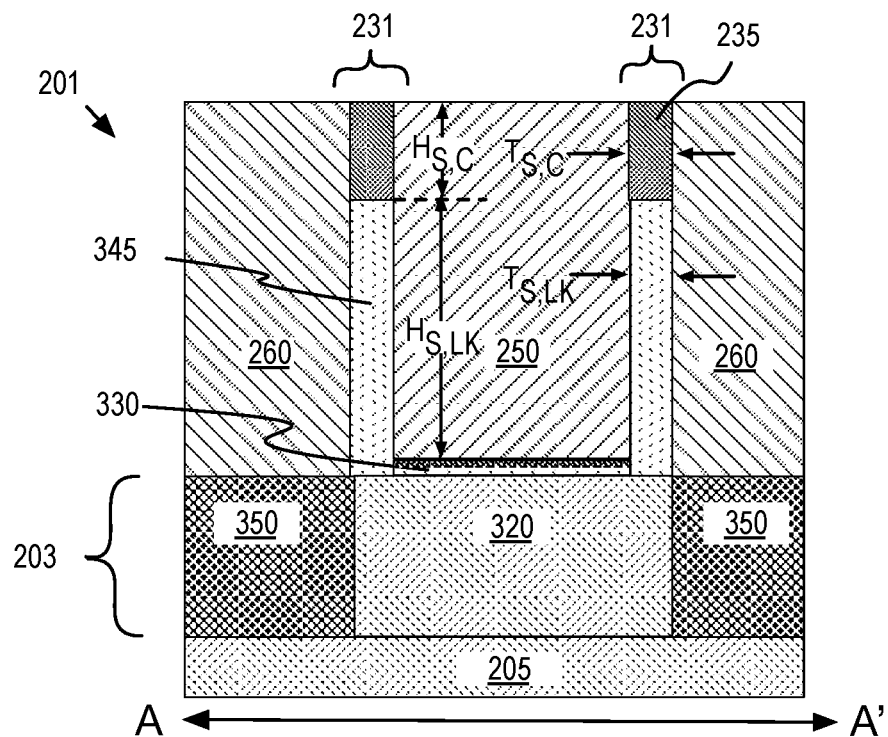
FIG. 4 illustrates a cross-sectional view through a length of channel semiconductor and source/drain semiconductor of the FET depicted in FIG. 2, in accordance with some alternative embodiments.

FIG. 4 illustrates some alternative embodiments of a hybrid spacer employed in FET 201. Here, hybrid spacer 231 includes only low-k dielectric 345 and spacer cap 235. For such embodiments, low-k dielectric 345 may comprise those materials described above in the context of FIG. 3. Spacer cap 235 may likewise comprise those materials described in the context of FIG. 3. FIG. 4 further illustrates embodiments where gate dielectric 330 does not form a liner on sidewalls of gate electrode 250. As such, low-k dielectric 345 is in direct contact with lower portions of both the gate electrode sidewall and source/drain contact metallization 260. Spacer cap 235 is in direct contact with upper portions of both the gate electrode sidewall and source/drain contact metallization 260. For such embodiments, low-k spacer thickness $T_{S,LK}$ is substantially equal to spacer cap thickness $T_{S,C}$. In some exemplary embodiments, low-k spacer thickness $T_{S,LK}$ and spacer cap thickness $T_{S,C}$ are 2-7 nm. For such embodiments where spacer cap 235 provides sufficient protection to low-k dielectric 345, a significant reduction in parasitic capacitance may be achieved, particularly where spacer cap height $H_{S,C}$ is minimized.

Figure 5:
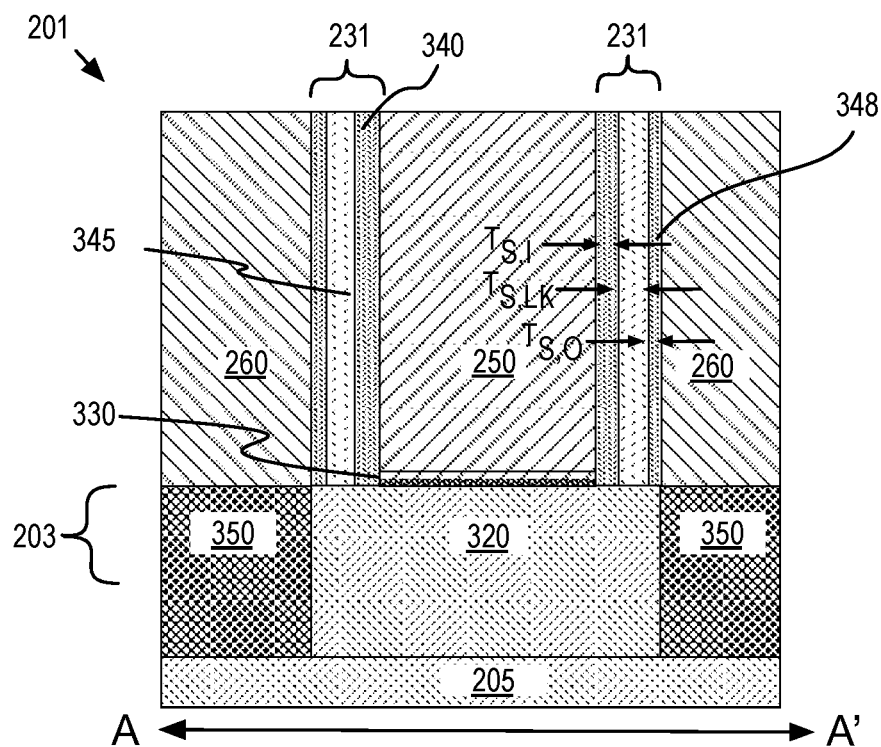
FIG. 5 illustrates a cross-sectional view through a length of channel semiconductor and source/drain semiconductor of the FET depicted in FIG. 2, in accordance with some alternative embodiments.

FIG. 5 illustrates some alternative embodiments of a hybrid spacer employed in FET 201. Here, hybrid spacer 231 includes only low-k dielectric 345, and inner and outer dielectric layers 340, 348. No spacer cap is present. For such embodiments, low-k dielectric 345 may again comprise those materials described above in the context of FIG. 3. Inner dielectric layer 340 and outer dielectric layer 348 may likewise comprise those materials described above in the context of FIG. 3. FIG. 5 further illustrates embodiments where gate dielectric 330 does not form a liner on sidewalls of gate electrode 250. As such, inner dielectric layer 340 is in direct contact with the entire sidewall height of gate electrode 250 (e.g., contacts both lower and upper portions the gate electrode sidewall). Outer dielectric 348 is in direct contact with the entire sidewall height of source/drain metallization 260. A liner of higher-k dielectric material therefore surrounds low-k dielectric layer 345 with only a top surface exposed. For such embodiments, low-k spacer thickness $T_{S,LK}$ is advantageously greater than either of the inner and outer dielectric layer thicknesses $T_{S,I}$, $T_{S,O}$. In some exemplary embodiments, low-k spacer thickness $T_{S,LK}$ is 2-5 nm while $T_{S,I}$ and $T_{S,O}$ are each 1-2 nm. For embodiments where adjacent liner layers provide sufficient protection to low-k dielectric 345, larger reductions in parasitic capacitance may be achieved where the higher-k liner dielectric layer thicknesses are minimized.

Figure 6:
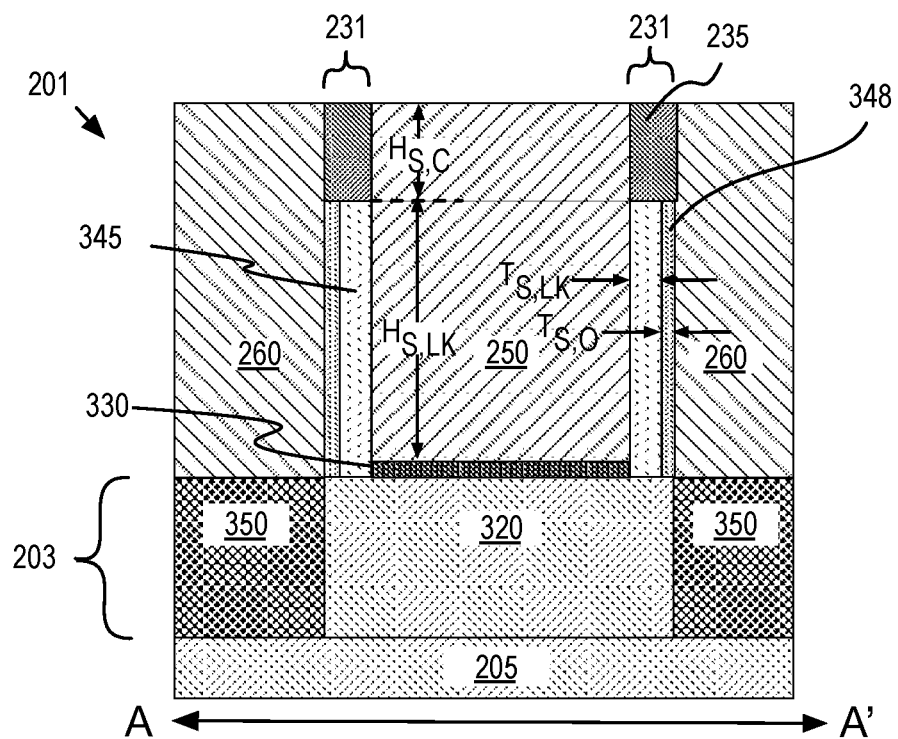
FIG. 6 illustrates a cross-sectional view through a length of channel semiconductor and source/drain semiconductor of the FET depicted in FIG. 2, in accordance with some alternative embodiments.

FIG. 6 illustrates some alternative embodiments of a hybrid spacer employed in FET 201. Here, hybrid spacer 231 includes low-k dielectric 345, spacer cap 235 and outer dielectric layer 348. Hybrid spacer 231 lacks an inner dielectric layer. Such embodiments may be advantageous where the inner surface of low-k dielectric 345 is not later subjected to detrimental processing. Low-k dielectric 345 may again comprise those materials as described above in the context of FIG. 3. Outer dielectric layer 348 and spacer cap 235 may likewise comprise those materials described above in the context of FIG. 3. FIG. 6 further illustrates embodiments where gate dielectric 330 does not form a liner on sidewalls of gate electrode 250. As such, low-k dielectric 345 is in direct contact with the lower portion the gate electrode sidewall while outer dielectric 348 is in direct contact with the lower portion of source/drain metallization 260. An outer shell covering both the sidewall and top surface of low-k dielectric 345 therefore protects low-k dielectric 345 from subsequent attack, for example during a SAC etch and/or strip. For such embodiments, low-k spacer thickness $T_{S,LK}$ is advantageously greater than dielectric layer thicknesses $T_{S,O}$. In some exemplary embodiments, low-k spacer thickness $T_{S,LK}$ is 2-5 nm while $T_{S,O}$ is 1-2 nm. In absence of the inner dielectric layer, a significant reduction in parasitic capacitance may be achieved, particularly where spacer cap height $H_{S,C}$ is minimized.

Figure 7:
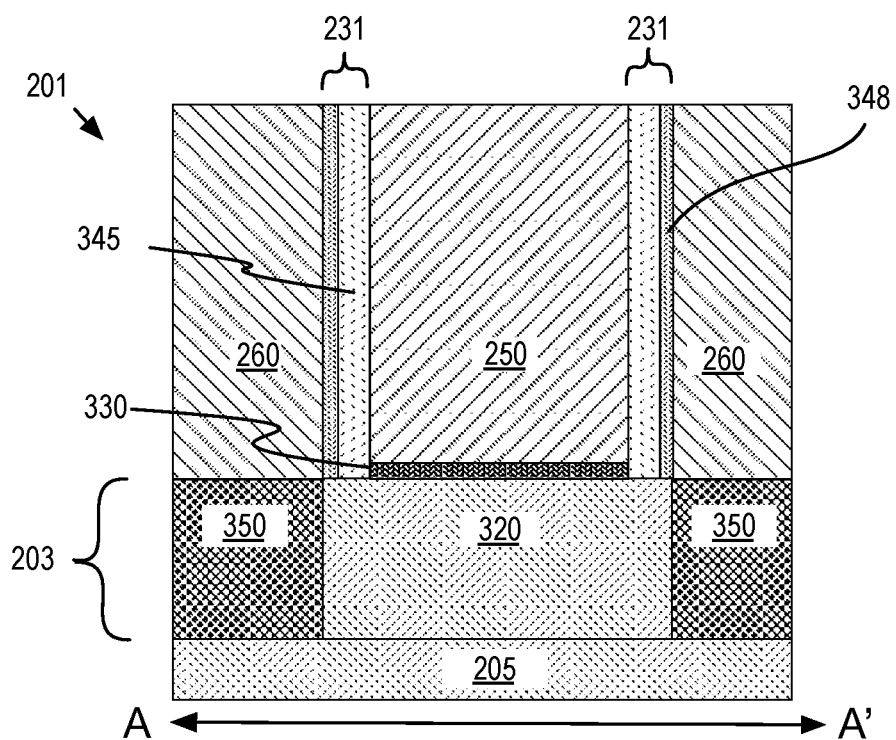
FIG. 7 illustrates a cross-sectional view through a length of channel semiconductor and source/drain semiconductor of the FET depicted in FIG. 2, in accordance with some alternative embodiments.

FIG. 7 illustrates some alternative embodiments of a hybrid spacer employed in FET 201. Here, hybrid spacer 231 includes only outer dielectric layer 348. Hybrid spacer 231 lacks an inner dielectric layer and a spacer cap. Such embodiments may be advantageous where the inner and top surfaces of low-k dielectric 345 are not later subjected to detrimental processing. Low-k dielectric 345 may again comprise those materials as described above in the context of FIG. 3. Outer dielectric layer 348 may likewise comprise those materials described above in the context of FIG. 3. FIG. 7 further illustrates embodiments where gate dielectric 330 does not form a liner on sidewalls of gate electrode 250. As such, low-k dielectric 345 is in direct contact with the entire gate electrode sidewall while outer dielectric 348 is in direct contact with the sidewall of source/drain metallization 260. The liner of higher-k dielectric material therefore forms an outer shell protecting a sidewall of low-k dielectric 345 from subsequent attack, for example during a SAC etch and/or strip. For such embodiments, low-k spacer thickness $T_{S,LK}$ is advantageously greater than dielectric layer thicknesses $T_{S,O}$. In some exemplary embodiments, low-k spacer thickness $T_{S,LK}$ is 2-5 nm while $T_{S,O}$ is 1-2 nm.

Figure 8:
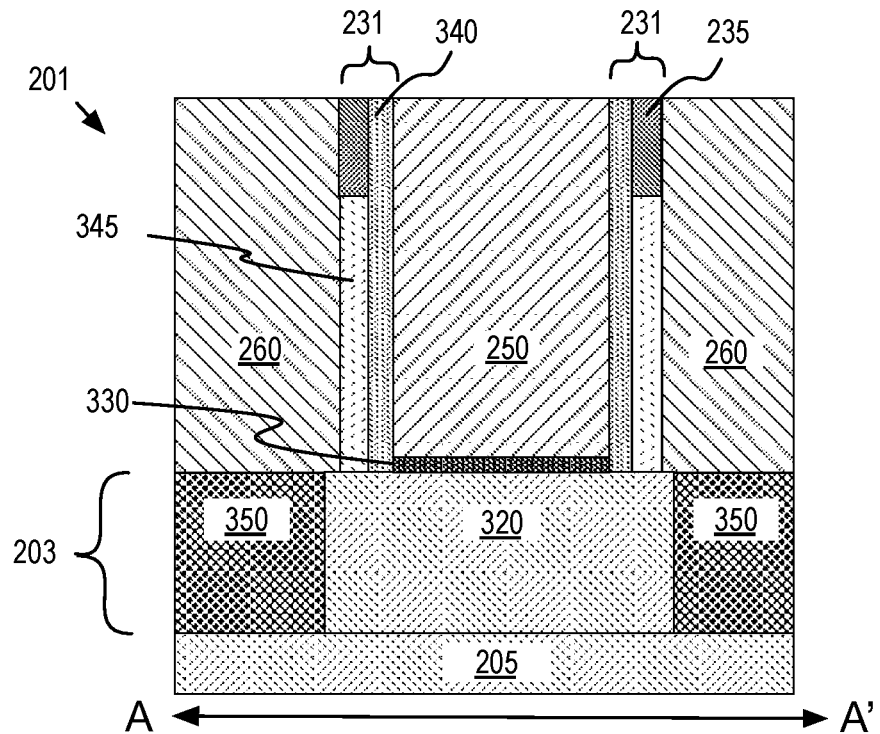
FIG. 8 illustrates a cross-sectional view through a length of channel semiconductor and source/drain semiconductor of the FET depicted in FIG. 2, in accordance with some alternative embodiments.

FIG. 8 illustrates some alternative embodiments of a hybrid spacer employed in FET 201. Here, hybrid spacer 231 includes low-k dielectric 345, spacer cap 235 and inner dielectric layer 340. Hybrid spacer 231 lacks an outer dielectric layer. Such embodiments may be advantageous where the outer surface of low-k dielectric 345 is not later subjected to detrimental processing (e.g., where source/drain metallization 260 is formed prior to the formation of hybrid spacer 231). Low-k dielectric 345 may again comprise those materials as described above in the context of FIG. 3. Inner dielectric layer 340 and spacer cap 235 may likewise comprise those materials described above in the context of FIG. 3. FIG. 8 further illustrates embodiments where gate dielectric 330 does not form a liner on sidewalls of gate electrode 250. As such, inner dielectric layer 340 is in direct contact with the gate electrode sidewall while low-k dielectric 345 is in direct contact with a lower portion of source/drain metallization 260. The presence of inner dielectric layer 340 between both low-k dielectric 345 and spacer cap 235 is indicative of spacer cap 235 replacing a portion low-k dielectric 345 selectively to inner dielectric layer 340. Spacer cap 235 and inner dielectric layer 340 form an inner shell covering both the sidewall and top surface of low-k dielectric 345, for example protecting low-k dielectric 345 from subsequent attack, perhaps during a sacrificial gate replacement etch and/or strip. For such embodiments, low-k spacer thickness $T_{S,LK}$ is again approximately equal to spacer cap thicknesses $T_{S,C}$. In some exemplary embodiments, low-k spacer thickness $T_{S,LK}$ is 2-5 nm while $T_{S,I}$ is 1-2 nm.

Figure 9:
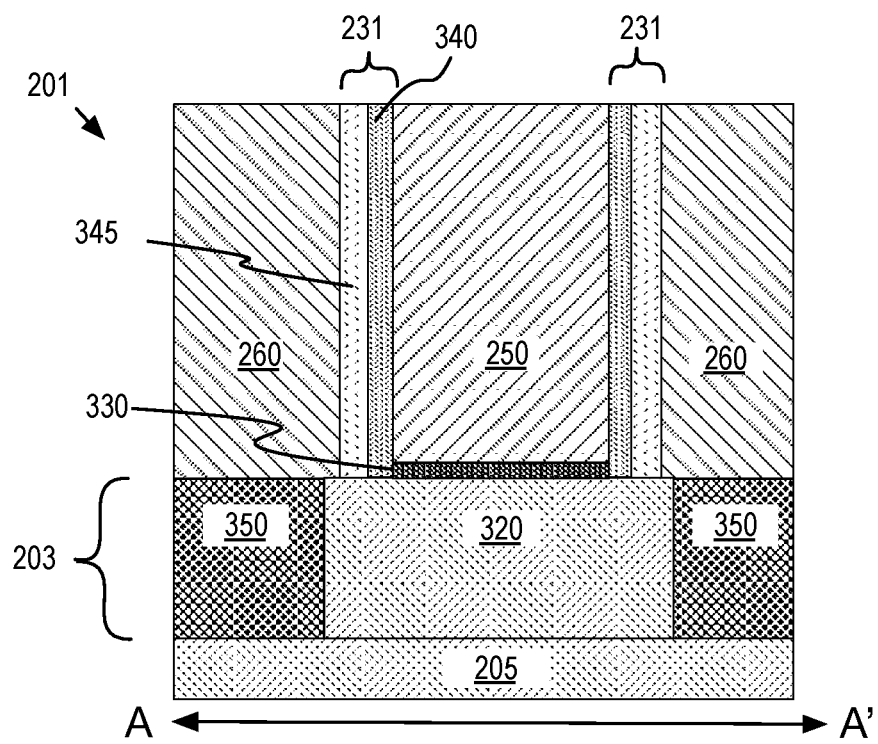
FIG. 9 illustrates a cross-sectional view through a length of channel semiconductor and source/drain semiconductor of the FET depicted in FIG. 2, in accordance with some alternative embodiments.

FIG. 9 illustrates some alternative embodiments of a hybrid spacer employed in FET 201. Here, hybrid spacer 231 includes only inner dielectric layer 340. Hybrid spacer 231 lacks an outer dielectric layer and a spacer cap. Such embodiments may be advantageous where the outer and top surfaces of low-k dielectric 345 are not later subjected to detrimental processing. Low-k dielectric 345 may again comprise those materials as described above in the context of FIG. 3. Inner dielectric layer 340 may likewise comprise those materials described above in the context of FIG. 3. FIG. 9 further illustrates embodiments where gate dielectric 330 does not form a liner on sidewalls of gate electrode 250. As such, inner dielectric layer 340 is in direct contact with the entire gate electrode sidewall while low-k dielectric 345 is in direct contact with the entire sidewall of source/drain metallization 260. The liner of higher-k dielectric material therefore forms an inner shell protecting a sidewall of low-k dielectric 345 from subsequent attack, for example during a sacrificial gate etch and/or strip. For such embodiments, low-k spacer thickness $T_{S,LK}$ is advantageously greater than dielectric layer thicknesses $T_{S,I}$. In some exemplary embodiments, low-k spacer thickness $T_{S,LK}$ is 2-5 nm while $T_{S,I}$ is 1-2 nm.

Figure 10:
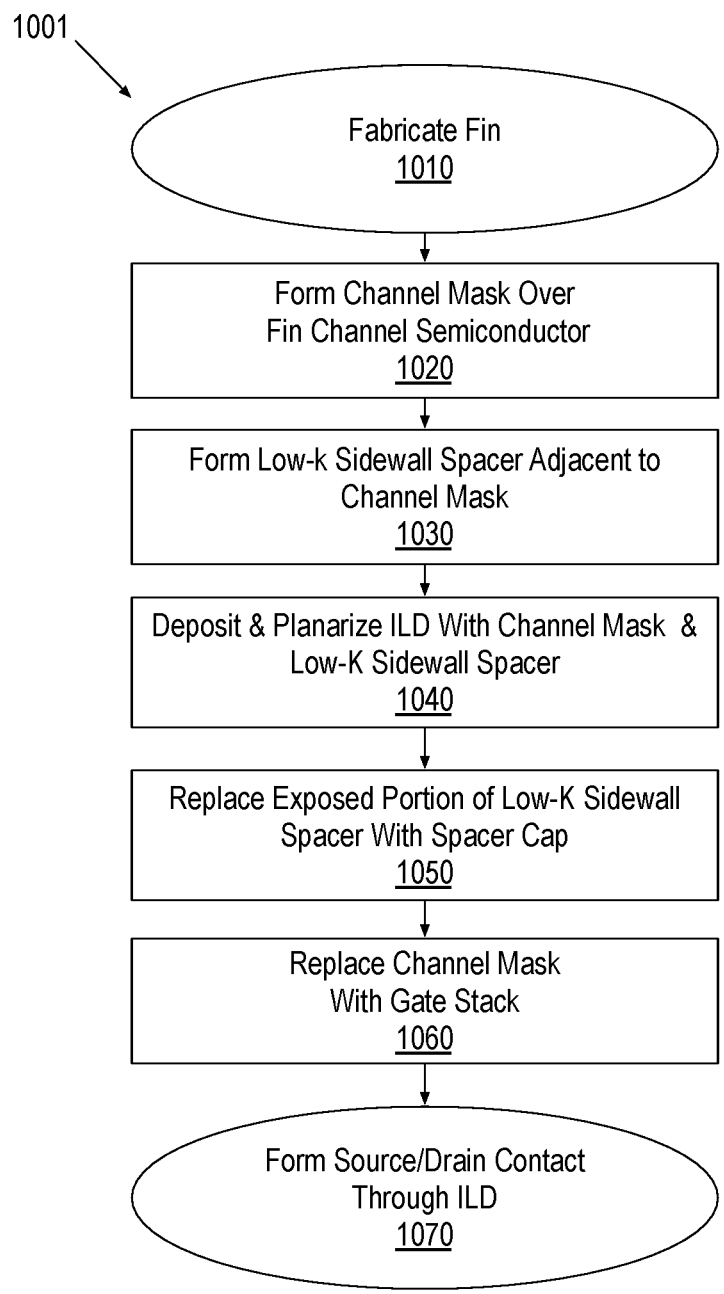
FIG. 10 is a flow diagram illustrating methods of forming a hybrid spacer, in accordance with some embodiments.
Figure 11:
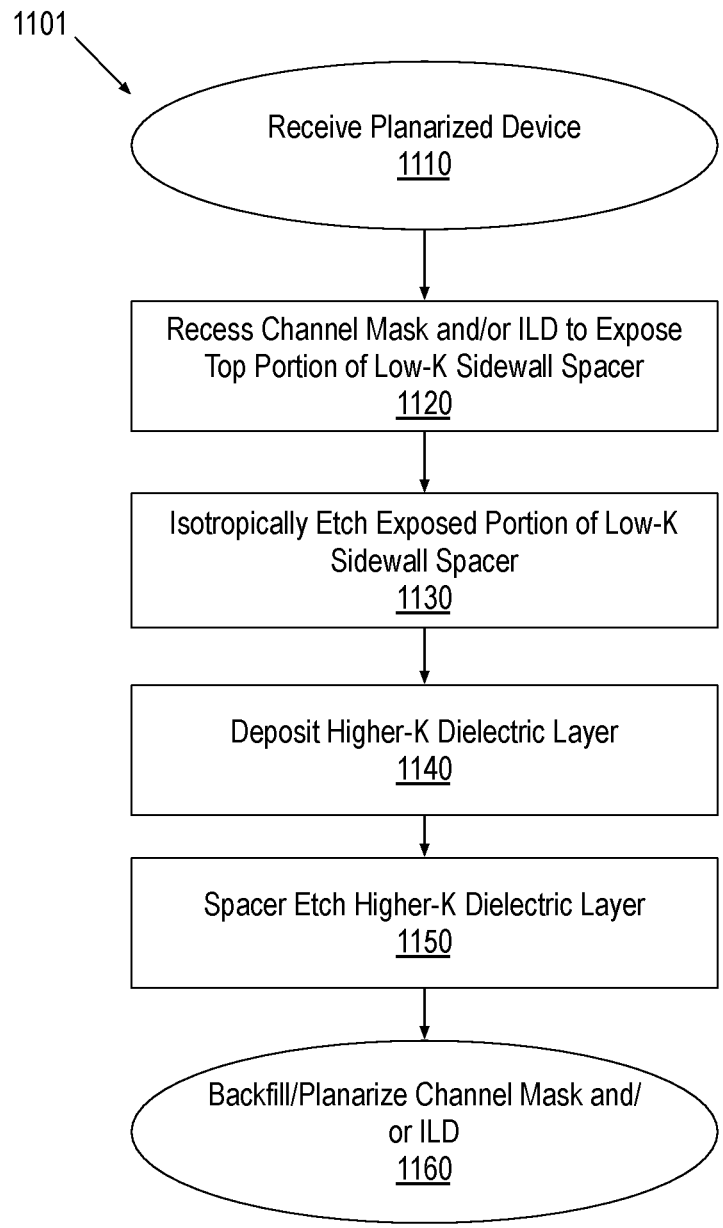
FIG. 11 is a flow diagram illustrating methods of forming a spacer cap, in accordance with some embodiments.
Figure 12:
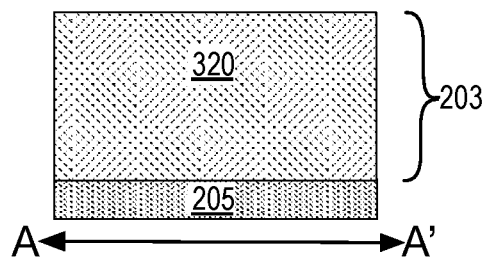
FIGS. 12, 13A, 13B, 13C, 14, 15A, 15B, 16A, 16B, 17A, 17B, 18A, 18B, 19, and 20 illustrate a cross-sectional view through a length of the channel semiconductor and source/drain semiconductor of a finFET evolving as the methods illustrated in FIGS. 10 and 11 are performed, in accordance with some embodiments.

FETs with a hybrid gate spacer in accordance with the architectures above may be fabricated by a variety of methods applying a variety of techniques and processing chamber configurations. FIG. 10 is a flow diagram illustrating exemplary methods 1001 for fabricating a finFET with a hybrid gate spacer, in accordance with some embodiments. FIG. 11 is a flow diagram illustrating methods 1101 for forming a spacer cap, in accordance with some embodiments. FIG. 12-21 illustrate cross-sectional views along the A-A' plane of finFET 201 evolving as the methods 1101 are performed, in accordance with some embodiments.

Referring first to FIG. 10, method 1001 begins at operation 1010 where a fin of semiconductor material is fabricated. In some embodiments, a fin is fabricated by epitaxially growing a semiconductor over a silicon substrate having a plurality of seeding surfaces. In some such embodiments, seeding surfaces are surrounded by high aspect ratio sidewalls to practice aspect ratio trapping (ART) and achieve acceptable crystal quality in the heteroepitaxial fin material. The ART technique is one example of local additive heteroepitaxial fin fabrication. In alternative embodiments, a conventional subtractive technique may be employed in which a blanket semiconductor layer or film stack is grown over, or transferred to, a working surface of a substrate. That blanket semiconductor is then etched into fin structures similarly amenable to subsequent operations of method 1001. In the exemplary embodiments illustrated by FIG. 12, upon completion of operation 1010, fin 203 is disposed on substrate layer 205 with channel semiconductor 320 within at least an upper portion of fin 203.

Method 1001 (FIG. 11) continues at operation 1020 where a channel mask is patterned to protect a portion of the semiconductor fin that is to be the channel semiconductor. While any known masking technique(s) and material(s) may be employed at operation 1020, in some embodiments, the channel mask is a sacrificial gate mandrel retained through a number of processes until being replaced in a "gate-last" finFET fabrication flow. In alternative "gate first" embodiments, the channel mask formed at operation 1020 is the permanent gate stack. At operation 1030, a low-k sidewall spacer including at least one low-k dielectric material layer is then formed along a sidewall of the channel mask.

Figure 13A:
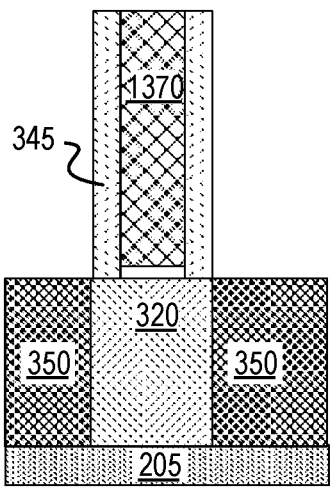
Figure 13B:
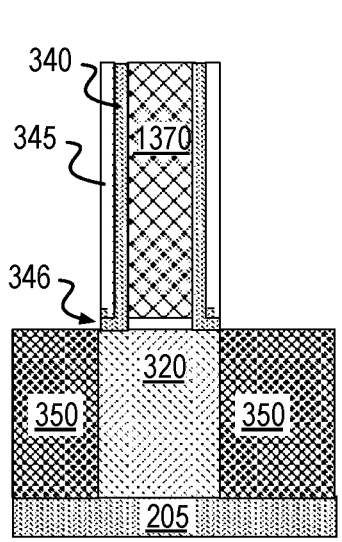
Figure 13C:
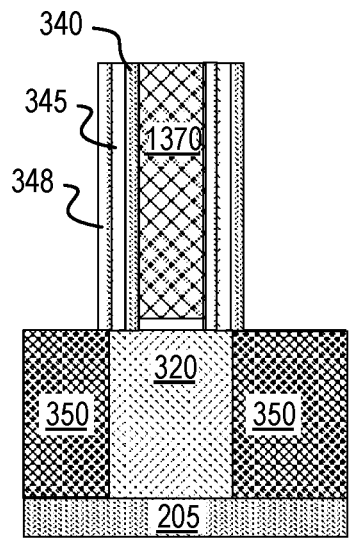

In the exemplary embodiment illustrated in FIGS. 13A, 13B and 13C, a sacrificial gate mandrel 1370 is formed over a channel portion of the fin 203. Any known sacrificial gate structure and fabrication techniques may be employed at operation 1020 to form sacrificial gate mandrel 1370 over at least two opposing sidewalls of channel semiconductor 320. Sacrificial gate mandrel 1370 may be patterned into a stripe of sacrificial material extending over channel semiconductor 320 and landing on adjacent field isolation dielectric. Other portions of fin 203 may remain exposed for subsequent source/drain formation.

FIG. 13A-13C illustrate three exemplary embodiments of a low-k spacer, which may be formed by various self-aligned lateral spacer processes. In some embodiments illustrated in FIG. 13A a single layer of low-k dielectric 345 is conformally deposited over fin 203 and sacrificial gate 1370, for example with a chemical vapor deposition or atomic layer deposition process. An anisotropic etch is then employed to clear the low-k dielectric material except along edges of the sacrificial gate mandrel topography (e.g., sidewalls). In some alternative embodiments illustrated in FIG. 13B, inner dielectric layer 340 is first conformally deposited over fin 203 and sacrificial gate 1370, for example with a chemical vapor deposition or atomic layer deposition process, and then a layer of low-k dielectric 345 is conformally deposited over inner dielectric layer 340, for example with a chemical vapor deposition or atomic layer deposition process. An anisotropic etch is then employed to clear the low-k dielectric material except along edges of the sacrificial gate mandrel topography (e.g., sidewalls). Inner dielectric layer 340 forms a foot 346 extending below low-k dielectric 345, which is indicative of a single spacer etch. Foot 346 may be absent in embodiments where two separate anisotropic spacer etches are performed (e.g., one after deposition of inner dielectric layer 340 and another after deposition of low-k dielectric 345). In some alternative embodiments illustrated in FIG. 13C, inner dielectric layer 340 is first conformally deposited over fin 203 and sacrificial gate 1370, for example with a chemical vapor deposition or atomic layer deposition process. A layer of low-k dielectric 345 is then conformally deposited over inner dielectric layer 340, for example with a chemical vapor deposition or atomic layer deposition process. Outer dielectric layer 348 is then conformally deposited over low-k dielectric 345, for example with a chemical vapor deposition or atomic layer deposition process. An anisotropic etch is then employed to clear dielectric material layers except along edges of the sacrificial gate mandrel topography (e.g., sidewalls). In the example illustrated in FIG. 13C, three anisotropic spacer etches have been performed (one after each dielectric layer deposition). However, in some alternative embodiments, a single anisotropic spacer etch may be performed after all three dielectric layers 340, 345 and 348 have been deposited.

Returning to FIG. 10, method 1001 proceeds to operation 1040 where ILD is deposited and planarized with the channel mask and low-k gate spacer. Prior to ILD deposition, source/drain semiconductors may be formed in or on the semiconductor fin. Any of metal-organic chemical vapor deposition (MOCVD), molecular beam epitaxy (MBE), hydride vapor phase epitaxy (HYPE), ion implantation, or the like, may be employed to form the source/drain semiconductor. In some embodiments, portions of the fin not protected by the channel mask or sub-fin isolation may be recess etched prior to epitaxial overgrowth of source/drain semiconductor. In the example illustrated by FIG. 14, portions fin 203 not protected by the channel mask or the gate spacer dielectrics have become source/drain semiconductor 360. As further shown in FIG. 14, the gate spacer dielectrics present during source/drain formation set the lateral spacing between the gate mandrel 1370 and source/drain semiconductor 360. Any ILD deposition and planarization process may then be employed to form ILD 1410. In some exemplary embodiments, ILD 1410 is one or more layer of silicon dioxide, silicon nitride, SiON, SiCN, or SiC. Other materials known to be suitable for the purpose may also be utilized. Following planarization, a top surface of each of the spacer dielectric layers (e.g., 340, 345, 348) is exposed.

Figure 14:
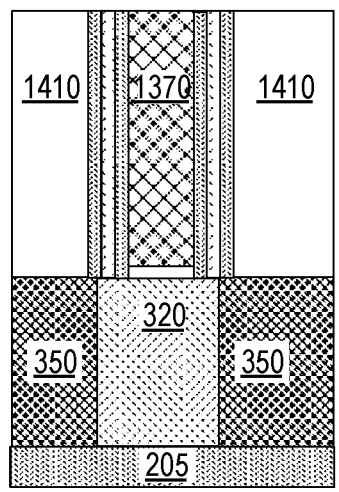
Figure 15A:
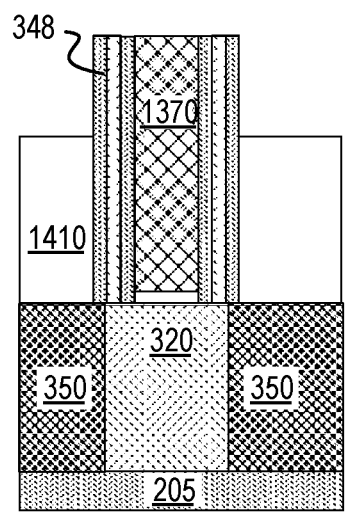
Figure 15B:
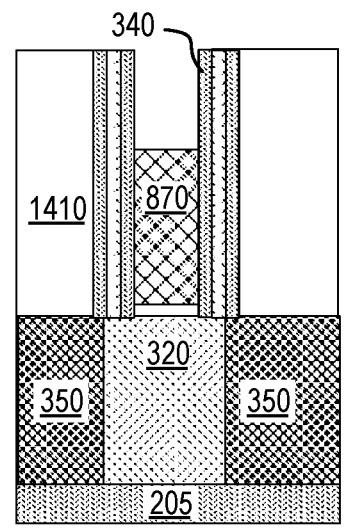

Returning to FIG. 10, method 1001 continues at operation 1050 where a portion of the low-k dielectric spacer is replaced with a spacer cap. Operation 1050 is optional as it may be skipped where only one or more of inner and outer dielectric layers are to protect the low-k dielectric within the gate spacer. For some embodiments, operation 1050 may be performed according to the method 1101 further illustrated in FIG. 11. Method 1101 begin with receiving the planarized device at operation 110, for example substantially as illustrated in FIG. 14. At operation 1120 (FIG. 11), the channel mask and/or ILD is recessed to expose a top portion of the low-k gate spacer. In the example illustrated in FIG. 15A, ILD 1410 is recessed selectively to gate mandrel 1370. The ILD recess etch may also be selective to spacer dielectric layer 345. The IDL recess etch may also be selective to layers 340 and 348, if present. In the example illustrated in FIG. 15B, gate mandrel 1370 is recessed selectively to ILD 1410. The gate mandrel recess etch may also be selective to spacer dielectric layer 345. The gate mandrel recess etch may also be selective to layers 340 and 348, if present.

Figure 16A:
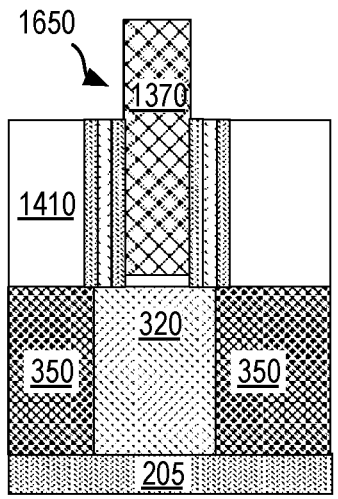
Figure 16B:
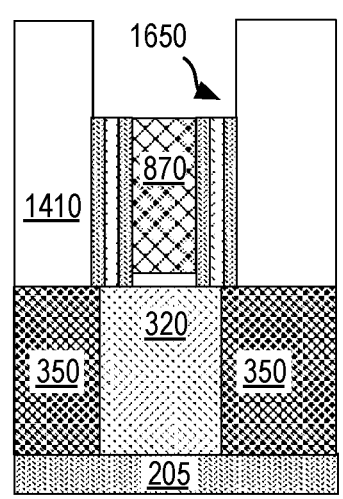

Returning to FIG. 11, method 1101 continues at operation 1130 where the exposed portion of the low-k dielectric material is etched. In exemplary embodiments, an isotropic etch process is employed to etch at least the low-k dielectric layer from the expose sidewall portion. The low-k gate spacer etch may proceed from either the interior or exterior surface of the low-k gate spacer. Where the low-k gate spacer includes both a low-k dielectric (e.g., 345) and higher-k dielectric layers (e.g., 340, 348), all of the dielectric layers may be removed, enlarging the recess 1650 as shown in FIG. 16A, 16B. Alternatively, the low-k dielectric etch process may be selective to one or more of the higher-k dielectric layers 340, 348 so that the recess is not enlarged beyond the thickness of the low-k dielectric material.

Figure 17A:
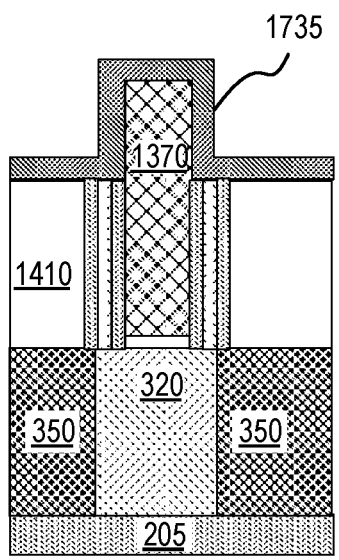
Figure 17B:
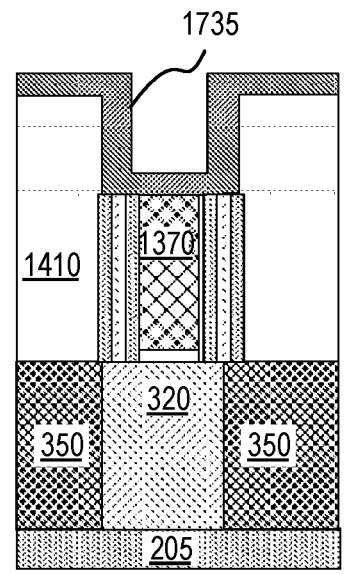
Figure 18A:
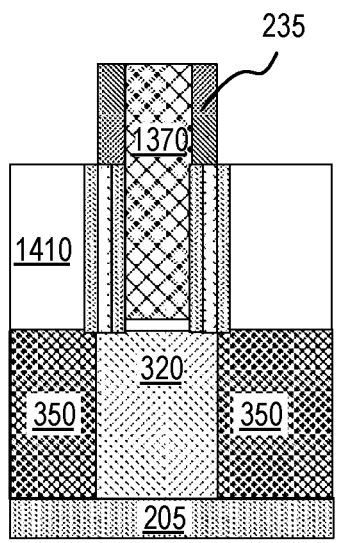
Figure 18B:
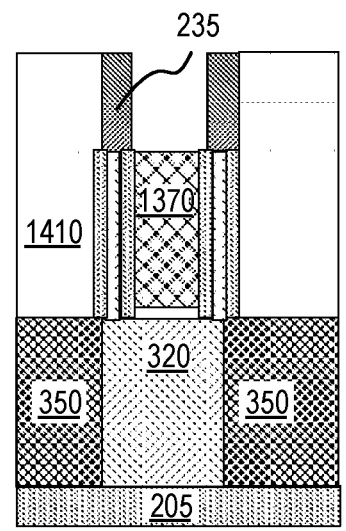

Returning to FIG. 11, method 1101 continues at operation 1140 where a higher-k dielectric material layer is deposited over the recess sidewall, for example with a chemical vapor deposition or atomic layer deposition process. This higher-k dielectric material is then spacer etched at operation 1150, for example with an anisotropic etch process is to clear the higher-k dielectric material except along edges of the recess to form a spacer cap. FIG. 17A, 17B further illustrate deposition of higher-k dielectric material layer 1735, which is then etched to form spacer cap 235, as shown in FIG. 18A, 18B.

Figure 19:
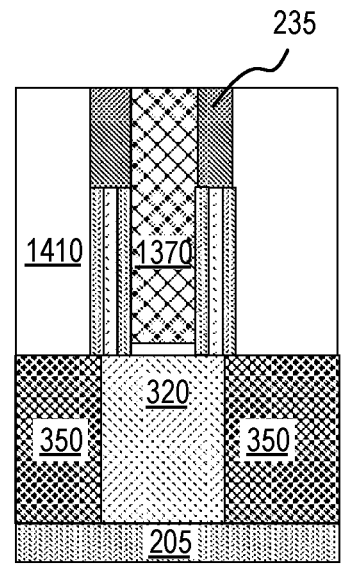
Figure 20:
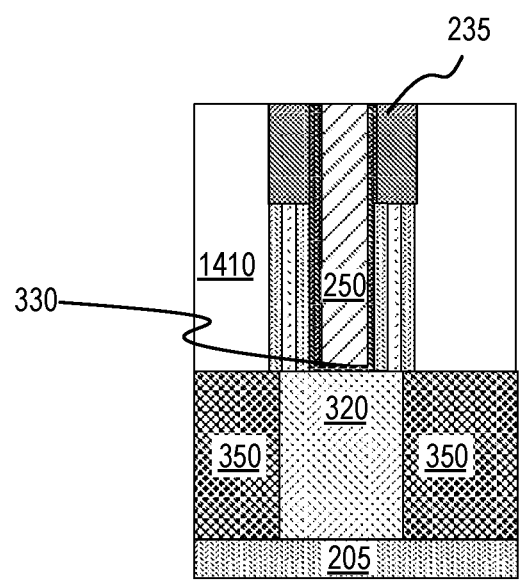

Method 1101 then completes at operation 1160 where any remaining recess is backfilled and/or planarized so that method 1001 may continue. Any deposition and planarization process known to be suitable for the particular ILD or gate mandrel may be performed at operation 1160. Upon completion of methods 1101, the transistor structure may be substantially as illustrated in FIG. 19.

Returning to FIG. 10, method 1001 continues at operation 1060 where the channel mask is replaced with a permanent gate stack. Method 1001 is then substantially complete with the formation of any suitable source/drain (contact) metallization at operation 1070. For the exemplary embodiment further illustrated in FIG. 20, sacrificial gate mandrel 1370 is removed selectively relative to ILD 1410 and the hybrid spacer, thereby exposing channel semiconductor 320. A permanent gate stack including a gate dielectric 330 and gate electrode 250 is deposited into the void formed by removal of the sacrificial gate. The structure of FET 201 is then substantially as was introduced in FIG. 2, which is ready for backend processing by any known technique(s).

Figure 21:
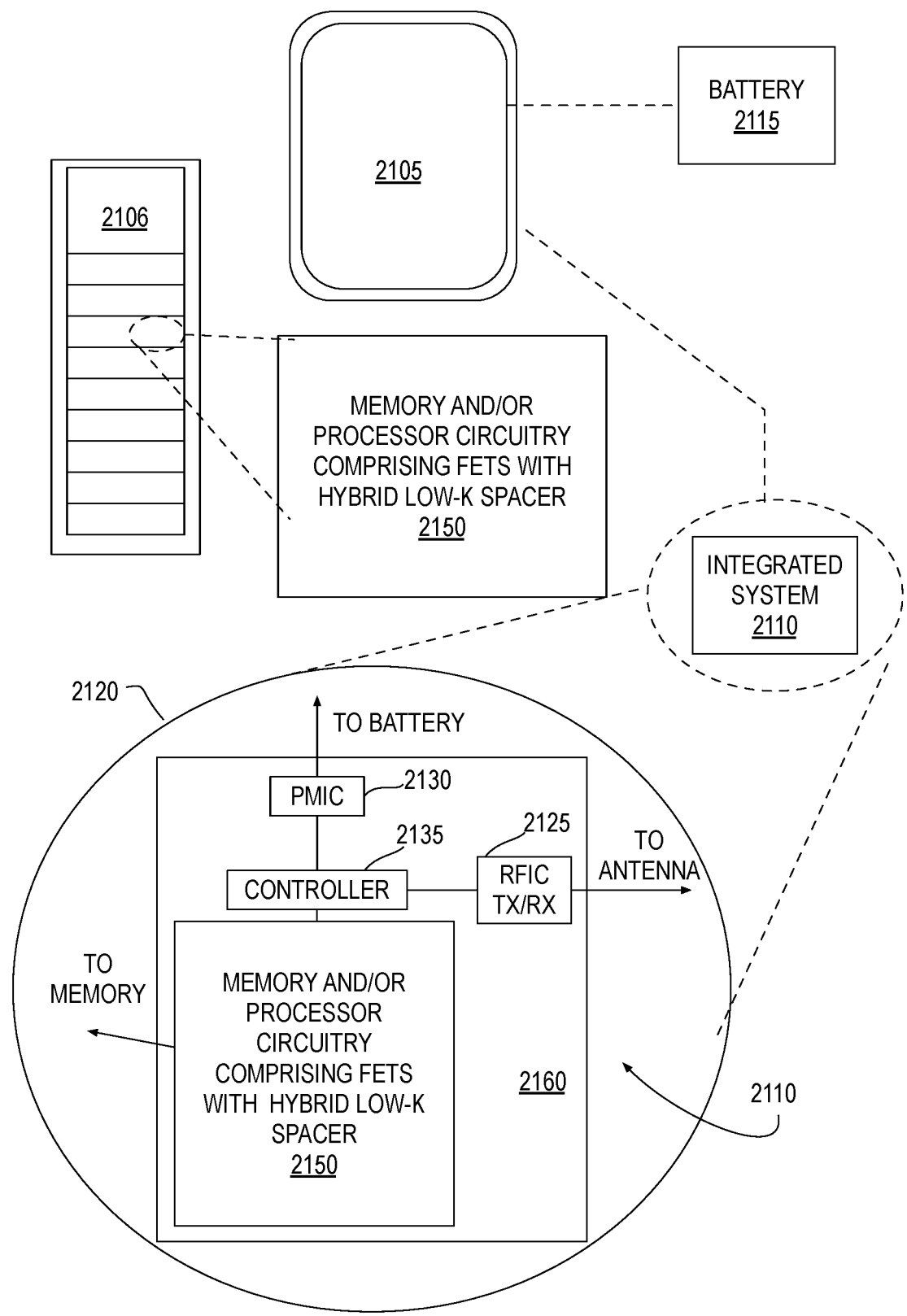
FIG. 21 illustrates a mobile computing platform and a data server machine employing an SoC having a plurality of FETs including a hybrid gate spacer, in accordance with embodiments.

FIG. 21 illustrates a mobile computing platform and a data server machine employing an SoC including FETs hybrid gate spacer, for example as described elsewhere herein. The server machine 2106 may be any commercial server, for example including any number of high-performance computing platforms disposed within a rack and networked together for electronic data processing, which in the exemplary embodiment includes a packaged monolithic SoC 2150. The mobile computing platform 2105 may be any portable device configured for each of electronic data display, electronic data processing, wireless electronic data transmission, or the like. For example, the mobile computing platform 2105 may be any of a tablet, a smart phone, laptop computer, etc., and may include a display screen (e.g., a capacitive, inductive, resistive, or optical touchscreen), a chip-level or package-level integrated system 2110, and a battery 2115.

Either disposed within the integrated system 2110 illustrated in the expanded view 2120, or as a stand-alone packaged chip within the server machine 2106, monolithic SoC 2150 includes a memory block (e.g., RAM), a processor block (e.g., a microprocessor, a multi-core microprocessor, graphics processor, or the like) including at least one finFET with hybrid gate spacer, for example as described elsewhere herein. The monolithic SoC 2150 may be further coupled to a board, a substrate, or an interposer 2160 along with, one or more of a power management integrated circuit (PMIC) 2130, RF (wireless) integrated circuit (RFIC) 2125 including a wideband RF (wireless) transmitter and/or receiver (TX/RX) (e.g., including a digital baseband and an analog front end module further comprises a power amplifier on a transmit path and a low noise amplifier on a receive path), and a controller 2135. In other embodiments, a discrete microprocessor a stand-alone packaged chip within the integrated system 2110 or as a stand-alone packaged chip within the server machine 2106. The discrete microprocessor includes at least one finFET with hybrid gate spacer, for example as described elsewhere herein.

Functionally, PMIC 2130 may perform battery power regulation, DC-to-DC conversion, etc., and so has an input coupled to battery 2115 and with an output providing a current supply to other functional modules. As further illustrated, in the exemplary embodiment, RFIC 2125 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 2150.

Figure 22:
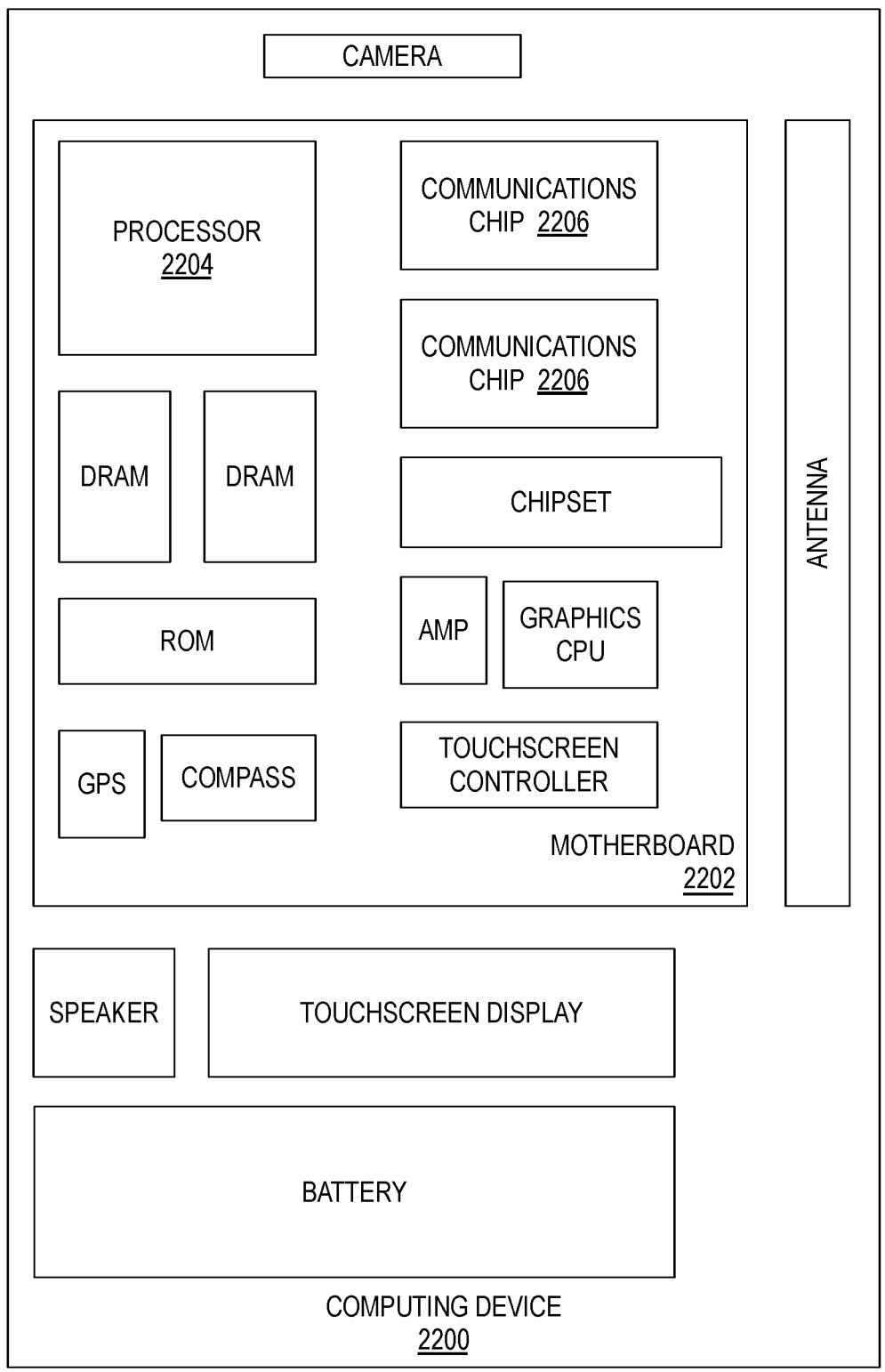
FIG. 22 is a functional block diagram of an electronic computing device, in accordance with some embodiments.

FIG. 22 is a functional block diagram of an electronic computing device, in accordance with some embodiments. Computing device 2200 may be found inside platform 2105 or server machine 2106, for example. Device 2200 further includes a motherboard 2202 hosting a number of components, such as, but not limited to, a processor 2204 (e.g., an applications processor), which may further incorporate at least one FET with a hybrid gate spacer, for example as described elsewhere herein. Processor 2204 may be physically and/or electrically coupled to motherboard 2202. In some examples, processor 2204 includes an integrated circuit die packaged within the processor 2204. In general, the term "processor" or "microprocessor" may refer to any device or portion of a device that processes electronic data from registers and/or memory to transform that electronic data into other electronic data that may be further stored in registers and/or memory.

In various examples, one or more communication chips 2206 may also be physically and/or electrically coupled to the motherboard 2202. In further implementations, communication chips 2206 may be part of processor 2204. Depending on its applications, computing device 2200 may include other components that may or may not be physically and electrically coupled to motherboard 2202. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 2206 may enable wireless communications for the transfer of data to and from the computing device 2200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2206 may implement any of a number of wireless standards or protocols, including but not limited to those described elsewhere herein. As discussed, computing device 2200 may include a plurality of communication chips 2206. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In first examples, a transistor comprises a source and a drain separated by a channel, a gate stack disposed over the channel, the gate stack comprising a gate dielectric and a gate electrode, and contact metallization coupled to the source and drain. The transistor comprises a spacer disposed between a lower portion of a sidewall of the gate electrode and at least one of the source, drain, or contact metallization, wherein the spacer comprises at least a first dielectric material. The transistor comprises a spacer cap disposed over the first dielectric material layer, and between an upper portion of the gate electrode sidewall and at least one of the source, drain, and contact metallization, wherein the spacer cap comprises at least a second dielectric material having a higher relative permittivity than the first dielectric material.

In second examples, for any one of the first examples the first dielectric material has a relative permittivity below 5.0.

In third examples, for any one of the first or second examples the second dielectric material has a relative permittivity of at least 5.0.

In fourth examples, for any one of the first, second, or third examples, the first dielectric material has a layer thickness of at least 2 nm, the gate electrode sidewall has a height of 30-50 nm, the upper portion of the gate electrode sidewall has a height of 5-10 nm.

In fifth examples, for any one of the first, second, third, or fourth examples the spacer further comprises an outer dielectric material disposed between the first dielectric material and the source, drain, or contact metallization, and the outer dielectric material has a higher relative permittivity than the first dielectric material.

In sixth examples, for any one of the fifth examples the spacer cap is disposed over the outer dielectric material.

In seventh examples, for any one of the sixth examples the outer dielectric material has a relative permittivity of at least 5.0.

In eighth examples, for any one of the first, second, third, fourth, fifth, sixth, or seventh examples, the spacer further comprises an inner dielectric material disposed between the first dielectric material and the gate electrode, and the inner dielectric material has a higher relative permittivity than the first dielectric material.

In ninth examples, for any one of the eighth examples the spacer cap is disposed over the inner dielectric material.

In tenth examples, for any one of the eighth or ninth examples, the inner dielectric material has a relative permittivity of at least 5.0.

In eleventh examples, for any one of the first, second, third, or fourth examples the spacer further comprises an inner dielectric material disposed between the first dielectric material and the gate electrode, and an outer dielectric material disposed between the first dielectric material and the source, drain, or contact metallization. The inner dielectric material and outer dielectric material have a higher relative permittivity than the first dielectric material.

In twelfth examples, for any one of the eleventh examples the spacer cap is disposed over both the inner and outer dielectric material.

In thirteenth examples, for any one of the eleventh or twelfth examples, each of the inner and outer dielectric material has a relative permittivity of at least 5.0.

In fourteenth examples, a CMOS integrated circuit (IC), comprises an n-type fin field effect transistor (finFET) disposed over a first region of a substrate, and a p-type finFET disposed over a second region of the substrate. Each of the n-type and p-type finFETs further comprise a source and a drain separated by a channel, a gate stack disposed over the channel, the gate stack comprising a gate dielectric and a gate electrode, and contact metallization coupled to the source and drain. Each of the n-type and p-type finFETs further comprise a first spacer disposed between a lower portion of a sidewall of the gate electrode and at least one of the source, drain, and contact metallization, wherein the first sidewall spacer comprises at least a first dielectric material. Each of the n-type and p-type finFETs further comprise a spacer cap disposed over the first dielectric material, and between an upper portion of the gate electrode sidewall and at least one of the source, drain, and contact metallization, wherein the spacer cap comprises at least a second dielectric material having a higher relative permittivity than the first dielectric material.

In fifteenth examples, for any one of the fourteenth examples the first dielectric material has a relative permittivity below 5.0, and the second dielectric material has a relative permittivity of at least 5.0.

In sixteenth examples, for any one of the fourteenth or fifteenth examples the first spacer further comprises at least one of an outer dielectric material disposed between the first dielectric material and the source, drain, or contact metallization an inner dielectric material disposed between the first dielectric material and the gate electrode. The outer or inner dielectric material has a higher relative permittivity than the first dielectric material.

In seventeenth examples, a mobile computer platform comprises a battery, a memory, and a processor coupled to the battery and memory. The processor includes the CMOS IC of any one of the fourteenth, fifteenth, or sixteenth examples.

In eighteenth examples, a method of fabricating a field effect transistor (FET), the method comprises forming a channel mask over a semiconductor fin, forming a spacer adjacent to the channel mask, the spacer comprising at least a first dielectric material, forming a source and drain on opposite sides of the channel mask, depositing an inter-layer dielectric (ILD) over the spacer and channel mask, planarizing the ILD with the channel mask and low-k spacer, replacing an exposed portion of the spacer with a spacer cap comprising at least a second dielectric material having a higher relative permittivity than the first dielectric material, and depositing contact metallization on the source and drain, wherein the spacer and the spacer cap separate the channel mask from at least one of the source, drain, and contact metallization.

In nineteenth examples, replacing the exposed portion of the spacer with the spacer cap further comprises exposing a sidewall of the spacer by recess etching the channel mask or the ILD, isotropically etching the spacer from the exposed sidewall, depositing the second dielectric material over the channel mask, ILD, and any remainder of the spacer, forming the spacer cap along a sidewall of the channel mask or ILD by anisotropically etching the second dielectric material, and backfilling any recess remaining in the channel mask or ILD.

In twentieth examples, for any one of the eighteenth or nineteenth examples, forming the channel mask further comprises depositing a sacrificial gate electrode layer over the fin, patterning the sacrificial gate electrode layer into a mandrel extending over the channel region, and replacing the mandrel with a permanent gate stack comprising a high-k gate dielectric and a metal gate electrode after replacing an exposed portion the spacer with the spacer cap.

In twenty-first examples, for any one of the twentieth examples replacing the mandrel with the permanent gate stack further comprises depositing the gate dielectric over the channel semiconductor and in direct contact with both the spacer and the spacer cap.

In twenty-second examples, for any of the eighteenth, nineteenth, twentieth, or twenty-first examples forming the spacer further comprises depositing, over the channel mask, an inner layer of dielectric material having a higher relative permittivity than the first dielectric material, depositing the first dielectric material over the inner dielectric material, and anisotropically etching the first and inner dielectric materials.

In twenty-third examples, for any of the eighteenth, nineteenth, twentieth, twenty-first, or twenty-second examples, forming the spacer further comprises depositing the first dielectric material over the channel mask, depositing, over the first dielectric layer, an outer dielectric material having a higher relative permittivity than the first dielectric material, and anisotropically etching the outer and first dielectric materials.

In twenty-fourth examples, for any of the eighteenth examples forming the spacer further comprises depositing, over the channel mask, an inner layer of dielectric material having a higher relative permittivity than the first dielectric material, depositing the first dielectric material over the inner dielectric material, depositing, over the first dielectric layer, an outer dielectric material having a higher relative permittivity than the first dielectric material, and anisotropically etching the outer, first, and inner dielectric materials.

In twenty-fifth examples, for any of the eighteenth, or nineteenth examples, forming the spacer further comprises at least one of: depositing over the channel mask an inner layer of dielectric material having a higher relative permittivity than the first dielectric material, depositing the first dielectric material over the inner dielectric material, and anisotropically etching the first and inner dielectric materials; or depositing the first dielectric material over the channel mask, depositing over the first dielectric layer an outer dielectric material having a higher relative permittivity than the first dielectric material, and anisotropically etching the outer and first dielectric materials However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure comprising:
   a source material and a drain material separated by a channel material;
   a gate stack over the channel material, the gate stack comprising a gate dielectric and a gate electrode material;
   contact metallization coupled to the source material and the drain material;
   a first dielectric material between a lower portion of a sidewall of the gate electrode material and at least one of the source material, drain material, or contact metallization;
   a second dielectric material over the first dielectric material, the second dielectric material between an upper portion of the sidewall of the gate electrode material and the contact metallization, and having a composition different than the first dielectric material; and
   a third dielectric material between the first dielectric material and the source material, drain material, or contact metallization, wherein the third dielectric material has a different composition than the first dielectric material.

2. The transistor structure of claim 1, wherein, the first dielectric material comprises Si and C.

3. The transistor structure of claim 2, wherein the first dielectric material further comprises at least one of O or N.

4. The transistor structure of claim 2, wherein the second and third dielectric materials comprise Si and at least one of O or N.

5. The transistor structure of claim 4, wherein the second dielectric material comprises Si and at least one of O and N.

6. The transistor structure of claim 4, wherein the third dielectric material comprises Si and N, or Si, O, and N, or Al and O, or Hf and O, or Hf and Ti.

7. The transistor structure of claim 6, wherein the third dielectric material extends along an outer sidewall of both the first dielectric material and the second dielectric material.

8. The transistor structure of claim 1, wherein a top surface of the second dielectric material is substantially planar with a top surface of the gate electrode material and the contact metallization.

9. The transistor structure of claim 1, further comprising a fourth dielectric material between the first dielectric material and the lower portion of a sidewall of the gate electrode material.

10. The transistor structure of claim 9, wherein the fourth dielectric material comprises Si and N, or Si, O, and N, or Al and O, or Hf and O, or Hf and Ti.

11. The transistor structure of claim 9, wherein the fourth dielectric material extends along an inner sidewall of both the first dielectric material and the second dielectric material.

12. A CMOS integrated circuit (IC), comprising:
   an n-type field effect transistor (FET) over a first region of a substrate; and
   a p-type FET over a second region of the substrate, wherein each of the n-type and p-type FETs further comprise:
      a source material and a drain material separated by a channel material;
      a gate stack over the channel material, the gate stack comprising a gate dielectric and a gate electrode material;
      contact metallization coupled to the source material and the drain material;
      a first dielectric material between a lower portion of a sidewall of the gate electrode material and at least one of the source material, drain material, or contact metallization;
      a second dielectric material over the first dielectric material, the second dielectric material between an upper portion of the sidewall of the gate electrode material and the contact metallization and having a composition different than the first dielectric material; and a third dielectric material between the first dielectric material and the source material, drain material, or contact metallization, wherein the third dielectric material has a different composition than the first dielectric material.

13. The CMOS IC of claim 12, wherein:
the first dielectric material comprises Si and C; and
the second and third dielectric materials comprise Si and at least one of N or O.

14. The CMOS IC of claim 13, wherein the first dielectric material comprises at least one of O or N.

15. The CMOS IC of claim 12, wherein, the first dielectric material comprises Si and C.

16. The CMOS IC of claim 15, wherein the first dielectric material further comprises at least one of O or N.

17. The CMOS IC of claim 12, wherein the second dielectric material comprises Si and at least one of O and N.

18. The CMOS IC of claim 17, wherein the third dielectric material comprises Si and at least one of O and N.

19. The CMOS IC of claim 12, wherein a top surface of the second dielectric material is substantially planar with a top surface of the gate electrode material.

20. A mobile computer platform, comprising:
a battery;
a memory; and
a processor coupled to the battery and memory, wherein the processor includes the CMOS IC of claim 12.

* * * * *